(12) United States Patent
Kidd et al.

(10) Patent No.: US 7,000,206 B2
(45) Date of Patent: Feb. 14, 2006

(54) TIMING PATH DETAILER

(75) Inventors: David A. Kidd, San Jose, CA (US); Matthew J. Page, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/949,977

(22) Filed: Sep. 24, 2004

(65) Prior Publication Data

US 2005/0039152 A1    Feb. 17, 2005

Related U.S. Application Data

(63) Continuation of application No. 10/283,866, filed on Oct. 30, 2002, now Pat. No. 6,834,379.

(51) Int. Cl.
*G06F 17/50* (2006.01)
(52) U.S. Cl. .................................. 716/6; 716/5; 716/7
(58) Field of Classification Search ................ 716/4–7
See application file for complete search history.

(56) References Cited

U.S. PATENT DOCUMENTS

| | | | |
|---|---|---|---|
| 5,872,717 A * | 2/1999 | Yu et al. ......................... | 716/6 |
| 2003/0131328 A1 * | 7/2003 | Barrick et al. ................. | 716/6 |
| 2003/0188268 A1 * | 10/2003 | Konstadinidis et al. ........ | 716/2 |

* cited by examiner

*Primary Examiner*—Vuthe Siek
*Assistant Examiner*—Binh Tat
(74) *Attorney, Agent, or Firm*—Garlick Harrison & Markison LLP

(57) ABSTRACT

A method (and a computer accessible medium comprising one or more instructions which, when executed, implement the method) is contemplated. At least a first timing path is identified in a first timing report corresponding to a first partition of a circuit. For at least one timing constraint applied to the first timing path, a second timing path in a second partition of the circuit that causes the timing constraint is determined. A second timing report comprising the first timing path from the first timing report and the second timing path from the second partition is generated.

6 Claims, 10 Drawing Sheets

| Partition B (Abstract Model) 60 | | |
|---|---|---|
| A-D | D1 | Path1 |
| D-G | D2 | Path1 |
| clk-G | D3 | Path2 |

Fig. 4

| Partition B (Debug Model) 62 | | | |
|---|---|---|---|
| Path1: | A-b | circuit | Delay |
| | b-c | circuit | Delay |
| | c-D | circuit | Delay |
| | ⋮ | | |
| Path2: | clk-D | circuit | Delay |
| | D-e | circuit | Delay |
| | ⋮ | | |

Fig. 5

| Constraint File 64 | | |
|---|---|---|
| A: | Valid t1 | Path3 |
| G: | Required t2 | Path4 |

Fig. 6

| Constraint Debug Model 66 | | | |
|---|---|---|---|
| Path3: | W-A | Partition A, Path5 | Delay |
| Path4: | G-P | Partition C, Path 6 | Delay |
| | | ⋮ | |

Fig. 7

TIMING PATH DETAILER

PRIORITY INFORMATION

This application is a continuation of and claims priority to U.S. patent application having an application Ser. No. 10/283,866; filed Oct. 30, 2002, now U.S. Pat. No. 6,834, 379, which application is hereby incorporated by reference.

BACKGROUND OF THE INVENTION

1. Field of the Invention

This invention is related to the field of integrated circuit development software, and particularly to timing software.

2. Description of the Related Art

Static timing analysis tools are used to estimate the delays on various timing paths through digital circuit designs. The resulting timing reports are analyzed by the designers to identify timing paths in the design which do not meet the timing goals of the digital circuit, and the designers attempt to change the design so that the design will meet the timing goals.

More recently, digital circuit designs (e.g. designs to be fabricated on a single integrated circuit) have increased in size and complexity as the number of transistors that may be fabricated on a single integrated circuit has increased. As the size of the design has increased, the size has exceeded the capability of various timing analysis tools to analyze the design in its entirety. Designers have responded by dividing the circuit designs into partitions, each of which can be handled by the timing analysis tools (and other integrated circuit design tools such as synthesis tools, layout tools, etc.). As used herein, a partition is a representation of a portion of the overall circuit, and has defined inputs and outputs. The inputs may be sourced by other partitions, or may be inputs of the overall circuit. The outputs may be supplied to other partitions, may be outputs of the overall circuit, or both.

FIG. 1 is a block diagram illustrating a portion of one embodiment of a design flow that includes timing analysis. Once the circuit design has been divided into one or more partitions, the designer may code a register-transfer level (RTL) description of each partition (reference numeral 10). Any hardware design language (HDL) may be used as the language for the RTL description (e.g. VHDL, Verilog, etc.). The RTL description may comprise one or more files per partition, as desired.

The designer may choose to use a synthesis tool to synthesize the RTL description to a netlist (reference numeral 12). The synthesis tool takes the RTL description and a library of cells (predesigned circuits which have one or more inputs and produce one or more outputs as a specified function of one or more inputs) and generates a netlist of cells, linked together in such a way as to provide the functionality described in the RTL description. On the other hand, the designer may choose to design the circuits manually, using a circuit schematic/schematic capture tool (reference numeral 14). The designer may use a combination of circuit schematic design and synthesis for a given partition.

The resulting netlists and schematic capture data may be provided to a timing analysis tool to estimate the timing of the design (i.e. to estimate whether or not the design will meet timing requirements for the circuit to operate at a desired clock frequency) (reference numeral 16). Based on the timing results, the designer may modify the RTL description and/or the circuit schematics to improve the timing (illustrated in FIG. 1 with the dotted lines from the timing analysis (reference numeral 16) to the RTL coding (reference numeral 10) and the circuit schematics (reference numeral 14)). At the point illustrated by reference numeral 16, delay from the nets interconnecting the cells and other circuitry may be estimated (since the layout has not yet been performed) rather than extracted.

At some point, the estimated timing calculated at reference numeral 16 may be near the timing goals for the integrated circuit, and the layout of the netlists may be performed (reference numeral 18). Alternatively, layout work may start in parallel with timing analysis, or may be performed before any timing analysis is performed, as desired. Generally, the layout includes placing the cells called out in the netlist into physical positions within the integrated circuit layout, and routing the nets which interconnect the cells using the wiring layers of the integrated circuit layout. The circuit schematics produced using the circuit schematic tools may already be laid out within the circuit, but may be placed within the overall layout and the inputs and outputs of the circuit may be connected to nets, similar to the cells.

The timing analysis tool may be executed again (reference numeral 20), using wire delays for the nets extracted from the integrated circuit layout. If timing goals are still not met, additional layout work, RTL coding, or schematic work may be used to improve timing (dotted lines from reference numeral 20 to reference numerals 10, 14, and 18). Once the timing goals are met, the design flow may continue toward fabricating the integrated circuit (not shown).

One embodiment of an exemplary circuit 30 is shown in FIG. 2, having multiple partitions (e.g. partition A 32A, partition B 32B, and partition C 32C illustrated in FIG. 2). Various timing paths are illustrated in FIG. 2 within the partitions 32A–32C. The direction of signal flow in FIG. 2 is from left to right. Generally, a timing path is a path through various circuitry in a partition (or among multiple partitions). The timing path may have an associated delay estimated by a timing analysis tool. The delay may or may not be short enough to meet the timing goals of the circuit 30.

In FIG. 2, various net names (that is, names used to represent nets in the circuit, wherein a net is an interconnecting signal that may be implemented with conductors on the integrated circuit) are illustrated as various letters. Capital letters are net names that are either partition inputs, partition outputs, or state points (controlled by clocks). Lower case letters illustrate net names that are the output of combinatorial logic circuits within the paths. Thus, in FIG. 2, the partition 32A includes a timing path 34A from a state point W through nets x and y to an output A (which is an input to the partition 32B). The partition 32B includes a timing path 34B from the input A through nets b and c to the state point D and continuing through nets e and f to an output G. Additionally, a timing path 34C is shown in the partition 34C from the input A through nets h, i, j, and k to the output G. Finally, a timing path 34D is shown in the partition 32C from the input G through nets l, m, n, and o to a state point P and continuing to an output Q. Generally, a state point is any point at which state may be captured according to a clock (e.g. a flop, register, latch, etc.). The timing paths 34A, 34B, and 34D together form a global timing path in the circuit 30, as do the timing paths 34A, 34C, and 34D.

A timing analysis of each of the timing paths 34A–34D would include the delays between each net in the path, thus supplying the designer with details permitting the rapid identification of circuitry which may be changed to improve the overall timing of the paths. However, to analyze the global timing paths in the circuit 30, a timing analysis of the circuit 30 is needed. While the timing paths 34A–34D may each individually appear to be short, a global timing path formed from the timing paths may not meet timing goals. As mentioned above, a timing analysis of the circuit 30 may be too large to perform using the detailed timing paths within each partition 32A–32C. A detailed timing path includes the intermediate details of delays through circuitry within a partition 32A–32C. On the other hand, an abstract model of each partition may be generated. The abstract model may eliminate some of the details from the detailed timing paths to generate corresponding abstracted timing paths. Thus, an abstracted timing path is a timing path which represents the delay of the timing path but which omits at least some details of the timing path.

For example, in some embodiments, an abstracted timing path may retain partition inputs, outputs, and state points. The abstracted timing path may include delays between the inputs, outputs, and state points. The delays in the abstracted timing paths may be the sum of the delays attributed to the underlying circuitry and interconnect delay, for the worst case delay from the input (or state point) to the output (or state point). Abstracted timing paths that retain partition inputs, partition outputs, and state points are sometimes referred to as gray models. In other embodiments, black models may be used (which retain partition inputs and partition outputs but not state points).

Since the abstract models of each partition include less information, the models are smaller and thus a timing analysis of the circuit 30 may be performed by the timing analysis tool using the abstract models. Unfortunately, however, the timing reports for the circuit 30 include only the abstracted timing paths. Designers desiring more information must look elsewhere than the timing reports generated for the circuit 30. Generally, a timing report is a list of timing paths and the estimated delays on those timing paths.

FIG. 3 is a flowchart illustrating one embodiment of timing analysis for the circuit 30. The flowchart of FIG. 3 may illustrate the general operation of any of a variety of timing analysis tools that may be available commercially (e.g. PathMill available from Synopsys, Inc. of Mountain View, Calif.) as well as other activity performed during timing analysis.

The timing analysis tool may generate an abstract model and a partition debug model for each of the partitions (block 40), using timing analysis at the partition level to identify the timing paths to be retained in the abstract model. That is, the timing path causing the worst case delay from an input (or state point) to a state point or output is retained in the abstract model, and other timing paths from the input to the same state point or output are abstracted out. Additionally, the retained timing path is abstracted from its detailed form (e.g. the form shown in FIG. 2) to a delay from the input (or state point) to the state point or output, eliminating intermediate nets generated by combinatorial logic within the timing path. The abstracted timing path retains enough information to estimate timing delays for the circuit 30 as a whole, but does not retain the detailed information for each timing path within the partition. The partition debug model may include the details of the retained timing paths, but does not include the details of the timing paths which were not retained. For example, if the path 34B is longer than the path 34C in FIG. 2, the path 34C may not be included in the partition debug model.

An example of an abstract model 60 for partition 32B is illustrated in FIG. 4 (assuming that the path 34B is retained and the path 34C is not retained). The path 34B may be abstracted to three "arcs" having corresponding delays in this example: A first arc having a delay D1 from the input A to the state point D, a second arc having the delay D2 from the state point D to the output G, and a third arc having the delay D3 from the clock controlling the state point D to the output G. The delay D1 may thus be the sum of the delays from the input A to the net b, from the net b to the net c, and from the net c to the state point D. Similarly, the delay D2 may be the sum of the delays from the state point D to the net e, from the net e to the net f, and from the net f to the output G; and the delay D3 may be the sum of the delays from the clock (clk) to the state point D, from the state point D to the net e, from the net e to the net f, and from the net f to the output G. Each arc is represented by an entry in the abstract model.

The abstract model may also include a path number for each arc (e.g. represented by the labels Path1 and Path2 in the abstract model of FIG. 4). While a path number is used herein, in general a path identifier of any type may be used (e.g. a number, an alphanumeric string, etc.). The path number may be a value generated by the timing analysis tool to identify a corresponding detailed timing path in the partition debug model. Generally, the form of each entry in the abstract model may vary from timing analysis tool to timing analysis tool. Typically, entries in the abstract model may include at least the net names of the beginning and end of each abstracted path, the delay, and the path number.

An exemplary partition debug model 62 is illustrated in FIG. 5. For each path number, detailed timing path information is maintained. For example, Path1 may include the path from input A to net b, from net b to net c, etc. up to the path from net f to output G. Path2 may include the path from the clock to the state point D, from the state point D to net e, etc. up to the path from the net f to output G. The detailed path may include any desired information. For example, in FIG. 5, the circuit responsible for the delay may be identified, as well as the delay. Any other information may be retained as desired.

Returning to FIG. 3, the timing analysis tool may perform a timing analysis at the circuit level using the abstract models of each partition (block 42). The timing analysis tool may generate a circuit-level timing report, identifying abstracted paths through one or more partitions of the circuit 30 which do not meet the timing goals of the circuit 30 (block 44). The circuit level timing report may identify problematic global timing paths, but does not include the detailed information of the timing paths. Thus, a designer must refer to one or more debug models to find the details of the timing paths. Furthermore, only the worst case timing paths within a partition are retained, and thus other timing paths which may require fixing are not identified.

Additionally, the timing analysis tool may generate timing constraints for the partition inputs and outputs (block 46). Generally, a timing constraint is an indication of the estimated timing of a partition input or output based on the circuit level analysis. For partition inputs, the timing constraint may be a valid time indicating when the partition input is valid (e.g. a starting point for measuring path delay within the partition for paths that include the input). The valid time may be caused by the worst case timing path from other partitions to the partition input. For partition outputs, the constraint may be a required time by which the partition output is to be generated (if timing goals are to be met). The required time may be caused by the worst case timing path that the partition output feeds. The timing constraints may be written to a constraint file which may be used in partition-level timing analysis to identify timing paths in the partitions which are part of a problematic global timing path.

The timing constraints may then be input to the timing analysis tool along with each partition to generate partition-level timing reports (block 50). If the circuit 30 meets timing goals (decision block 52, yes leg), the timing analysis is complete. If the circuit 30 does not meet timing goals (decision block 52, no leg), the designer may examine the timing reports, make changes to improve timing, and begin the timing analysis again with the changed incorporated (block 54).

The partition-level timing reports may include detailed timing paths for the partition, as well as the timing constraints from the constraint file. Thus, the designer may have visibility, in the partition-level timing reports, to not only the worst case timing paths but also other timing paths that may have lower delay but may also need timing improvement to meet timing goals. However, the designer does not have visibility, in the partition-level timing reports, to details of the global timing paths of which a given local partition timing path may be a part. In some cases, it may be more profitable to implement changes in another partition to ease a timing constraint rather than to make changes within the partition.

An exemplary constraint file 64 is shown in FIG. 6. In the example of FIG. 6, a valid constraint t1 is assigned to the partition input A (for the partition 32B) and a required time t2 is assigned to the partition output G (for the partition 32B). Net A is also a partition output (of the partition 32A) in this example, and thus may also have a valid time constraint assigned for the partition 32A (not shown in FIG. 6). Similarly, net G is also a partition input (of the partition 32C) and thus may also have a required time constraint assigned for the partition 32C (not shown in FIG. 6). For each timing constraint, a path number may be included to identify the timing path that causes the timing constraint. For example, the valid timing constraint for the partition input A may be caused by path number Path3, and the required timing constraint for the partition output G may be caused by the path number Path4. The path numbers may refer to paths listed in a constraint debug model, described below.

The timing analysis tool may also generate a constraint debug model (block 48). The constraint debug model may include details of the timing paths which cause the timing constraints in the timing constraint file 64. An exemplary constraint debug model 66 is shown in FIG. 7. In the example of FIG. 7, Path3 may be the path from the state point W to net A in the partition 32A, generating a valid time constraint on the partition input A to the partition 32B. Path4 may be the path from G to P in the partition 32C, generating a required time constraint for the partition output G of the partition 32B. The constraint debug model may also include any other desired information (e.g. the delay for the path).

Since the constraint debug model is generated from the circuit level timing analysis, the timing paths listed in the constraint debug model may be abstracted timing paths. The corresponding detailed timing paths may be available in the partition debug models. Thus, the constraint debug model may include an identifier of the partition that contains the timing path and the path number in the partition debug model of the path. The designer may then examine the partition debug models to find the detailed path information for the timing path that causes a given timing constraint.

SUMMARY OF THE INVENTION

A method (and a computer accessible medium comprising one or more instructions which, when executed, implement the method) is contemplated. At least a first timing path is identified in a first timing report corresponding to a first partition of a circuit. For at least one timing constraint applied to the first timing path, a second timing path in a second partition of the circuit that causes the timing constraint is determined. A second timing report comprising the first timing path from the first timing report and the second timing path from the second partition is generated.

BRIEF DESCRIPTION OF THE DRAWINGS

The following detailed description makes reference to the accompanying drawings, which are now briefly described.

FIG. 4 is a block diagram of one embodiment of a partition abstract model.

FIG. 5 is a block diagram of one embodiment of a partition debug model.

FIG. 6 is a block diagram of one embodiment of a constraint file.

FIG. 7 is a block diagram of one embodiment of a constraint debug model.

Figure 1:
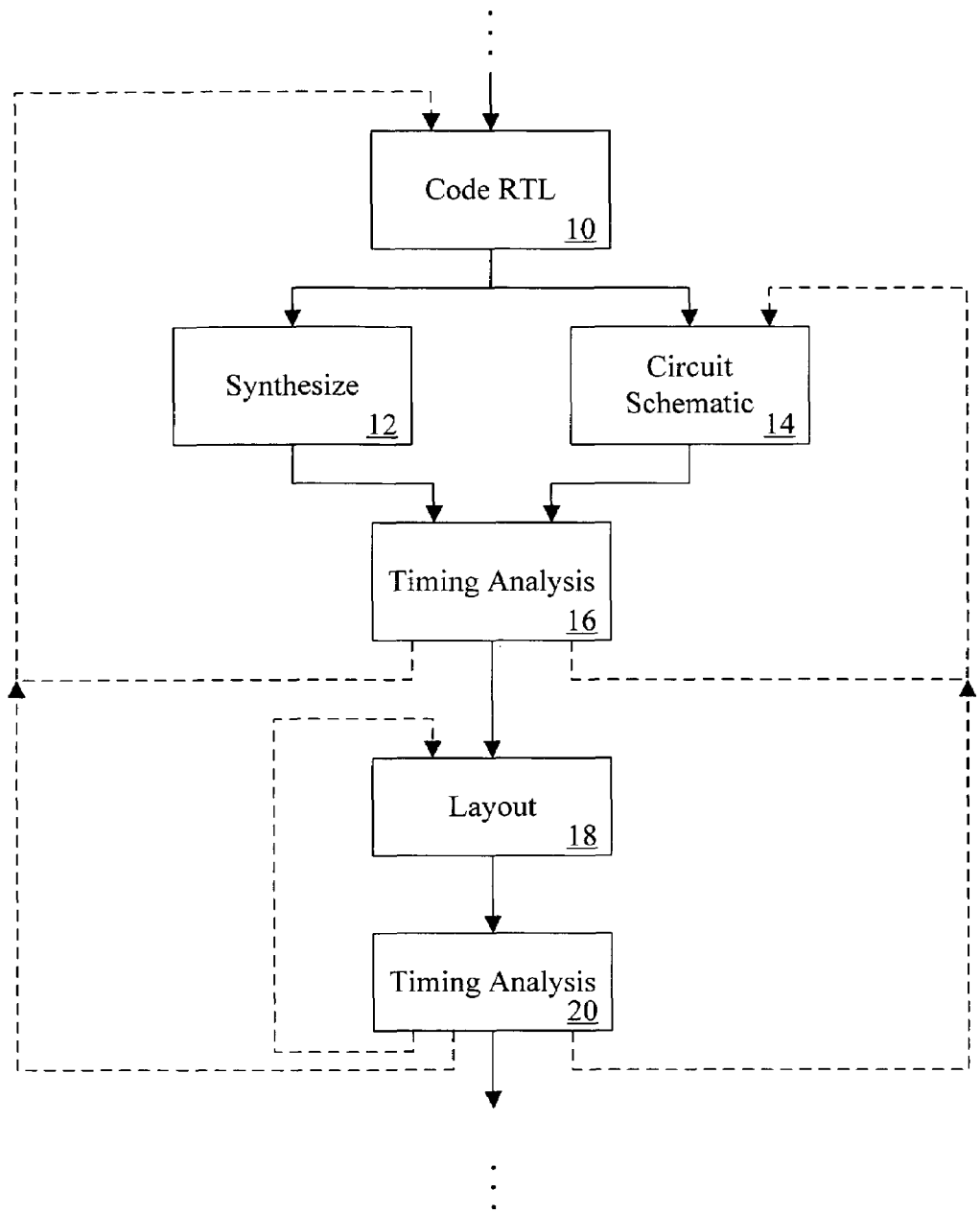
FIG. 1 is a block diagram illustrating a portion of one embodiment of a design flow, including timing analysis.
Figure 2:
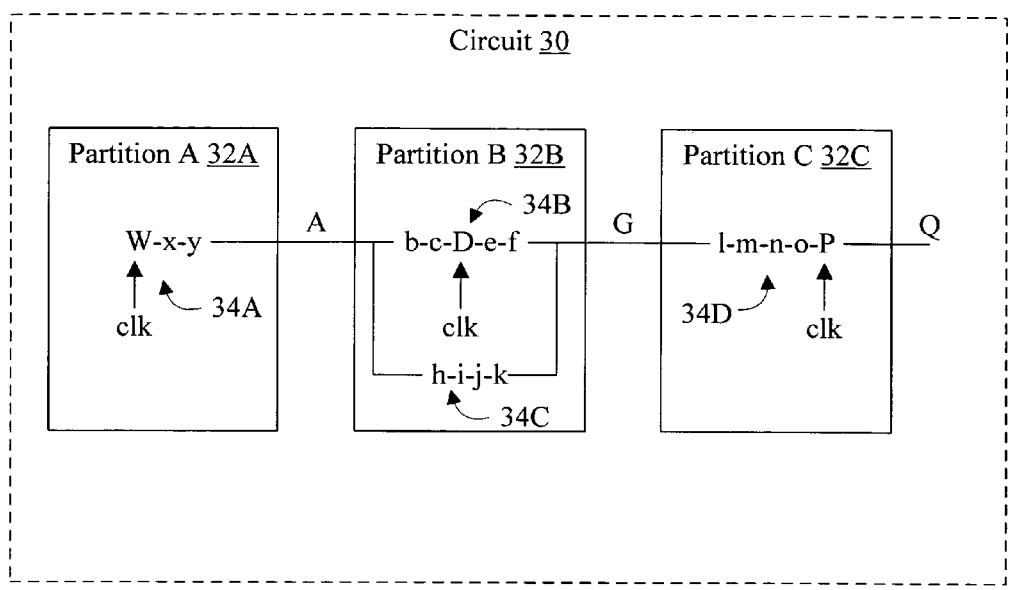
FIG. 2 is a block diagram illustrating an exemplary circuit and partitions thereof.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Several embodiments of a timing path detailer are described which merge details missing from the timing reports described above with information from the timing reports, thus generating timing reports which present a more complete view of the timing paths. The designers may have the more complete view in one report, which may permit designers to more efficiently identify the changes to be made to the circuit 30 to reach the timing goals of the circuit 30. In one embodiment, detailed timing path information is merged into the circuit-level timing reports. In another embodiment, detailed timing path information from other partitions is merged into partition-level timing reports (which may already include the detailed timing path within the partition). Viewed in another way, the timing path detailer may attempt to provide timing reports that more closely resemble timing reports that would be generated by a timing analysis tool if the circuit 30 were analyzed as a whole without abstracting the partition timing paths.

The timing path detailer, in one embodiment, may be a program comprising instructions which, when executed, perform the operations specified below. The timing path detailer may be encoded on a computer accessible medium, as discussed below with regard to FIG. 12.

Figure 8:
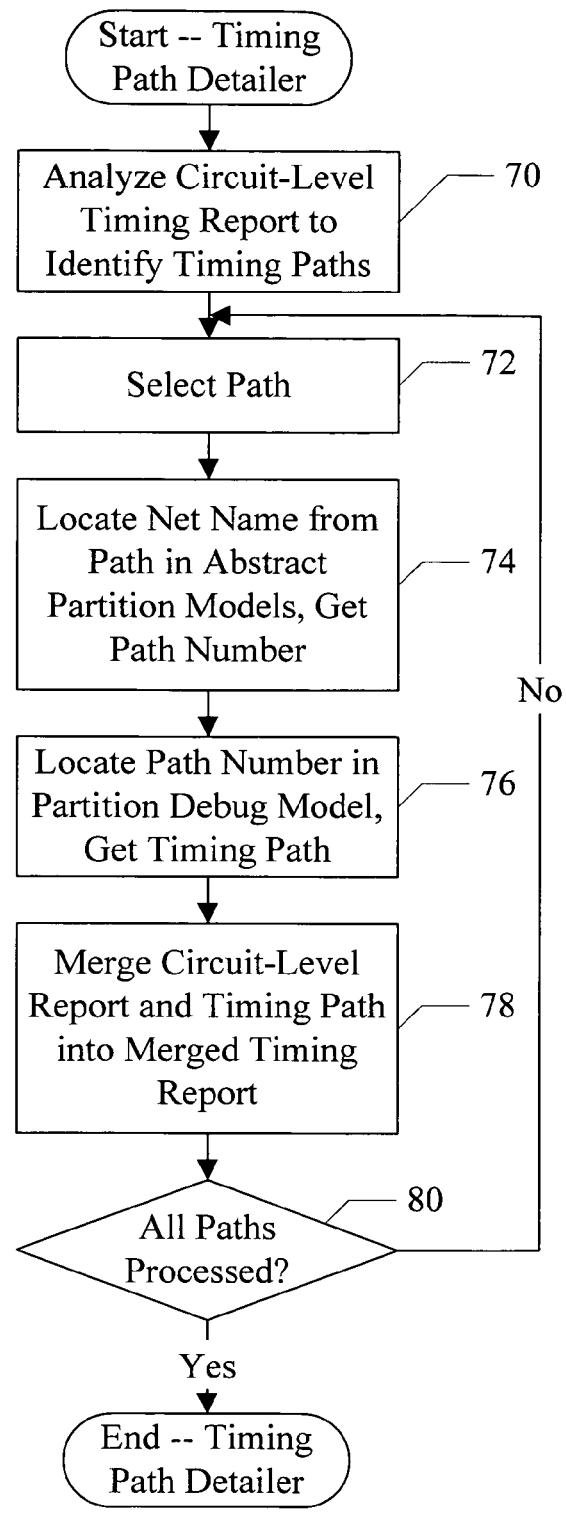
FIG. 8 is a flowchart illustrating operation of one embodiment of a timing path detailer.

Turning now to FIG. 8, a flowchart is shown illustrating operation of one embodiment of the timing path detailer which merges detailed timing paths with the circuit-level timing report.

Figure 3:
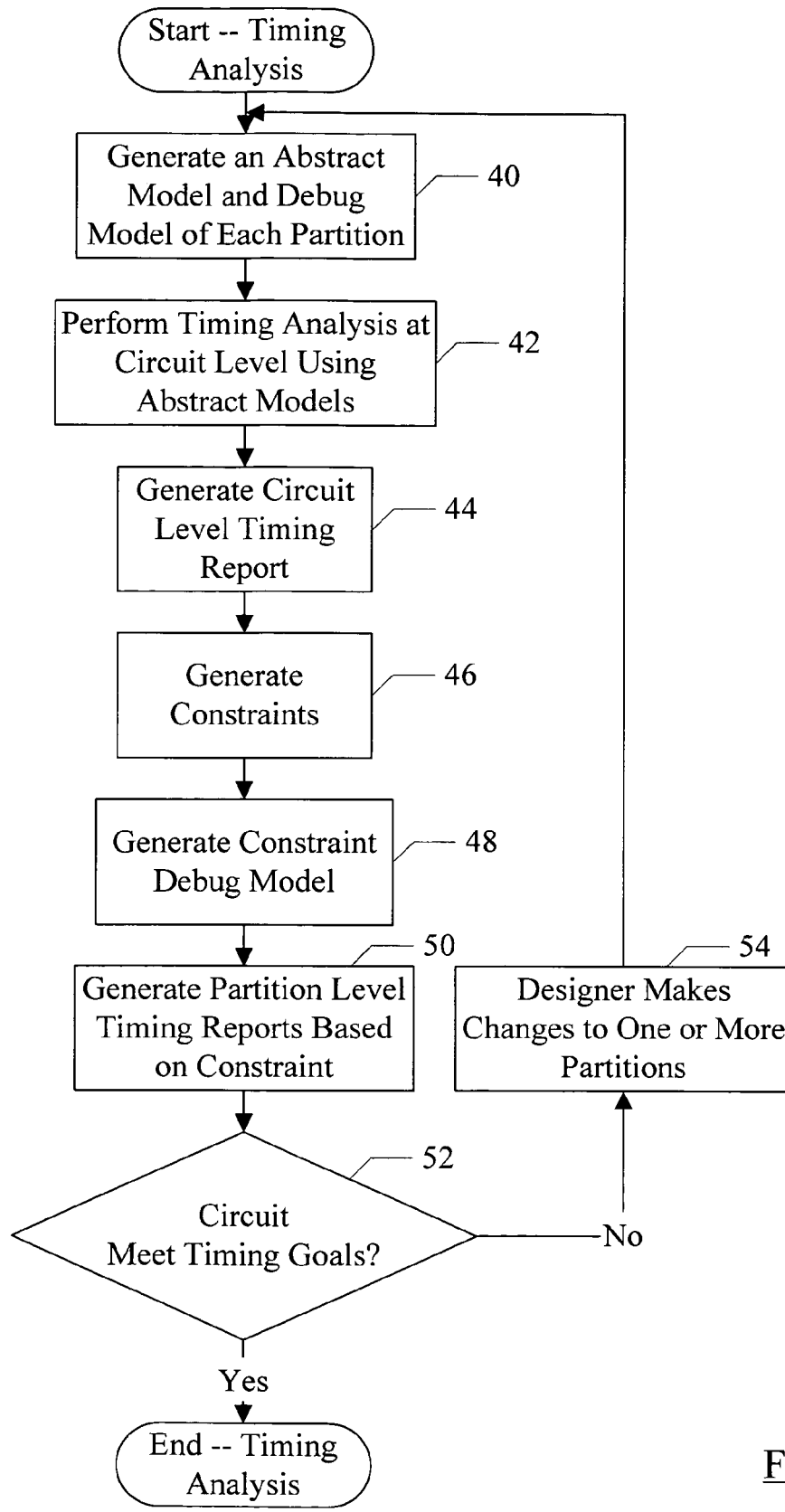
FIG. 3 is a flowchart illustrating one embodiment of timing analysis for a circuit having partitions.

The timing path detailer may analyze the circuit-level timing report for the circuit 30 (e.g., the timing report generated at block 44 in FIG. 3) to identify timing paths to be detailed (block 70). The timing path detailer may detail all timing paths, or only those paths which have a negative timing margin (that is, those timing paths that are not meeting timing goals), or only timing paths selected by the designer (e.g. via an input mechanism such as an input file).

The timing path detailer may select a timing path for which to generate the details, from the set of timing paths identified in block 70 (block 72). The path may be identified by a net name of a net that is not meeting timing goals (e.g. a partition output, a state point, etc.). The timing path detailer may search the abstract partition models to locate the net name, and obtain the corresponding path number (block 74). As mentioned above, while a path number is used in this embodiment, any path identifier may be used in other embodiments. In some embodiments, it may be possible for more than one path to be located for a net name. For example, if a path passes transparently through a state point, the transparent path and the path from the clock at the state point may be located.

The timing path detailer searches the partition debug model to locate the path number (block 76). The timing path detailer obtains the detailed timing path from the partition debug model based on the path number. If more than one path number is found, the timing path detailer may locate each path number in the partition debug model.

The timing path detailer merges the circuit-level timing report information for the timing path with the detailed path information for the timing path into a merged timing report (block 78). Thus, the merged timing report includes both the timing information from the circuit level and the corresponding timing path details from the partition debug models. Having the information gathered together may present a more complete view of the problematic timing path. For example, the detailed path information provides a more precise picture of the delays in the path, which may permit more rapid identification of the changes to be made to the partition to improve the timing path.

If there are additional timing paths to be processed (decision block 80—no leg), the timing path detailer may return to block 72, select the next path, and process the path. If there are no additional timing paths to be processed (decision block 80—yes leg), the timing path detailer has completed the merged timing report and may exit.

It is noted that, while the embodiment of FIG. 8 illustrates processing one timing path at a time, other embodiments may process paths interactively at the request of the designer. For example, the timing path detailer may be part of a timing tool that presents the timing report information (e.g. graphically), and, when a designer selects a given path to view more details, the timing path detailer may operate similar to blocks 72–78 to provide the detailed timing path.

Figure 9:
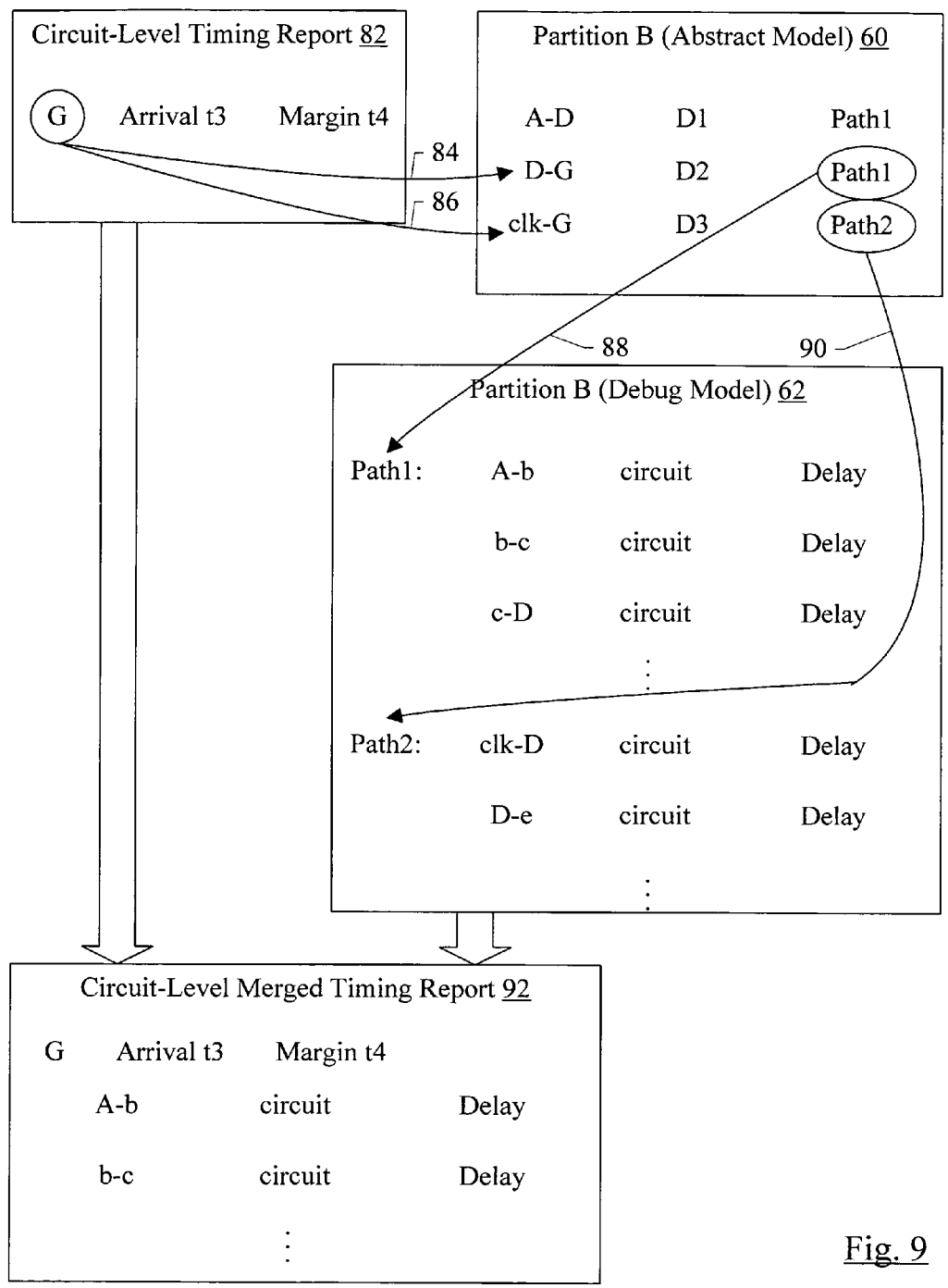
FIG. 9 is an example of the merging of timing information performed by the timing path detailer illustrated in FIG. 8.

FIG. 9 is an example illustrating the merging of a timing path identified in a circuit level timing report and the corresponding detailed timing path. The circuit-level timing report 82 is illustrated, which includes a timing path ending in net G, which has an arrival time t3 and a margin t4 (presumably negative for this example). The circuit-level timing report 82 may also include the abstracted timing path information also (not shown in FIG. 9). The timing path detailer searches for net G in the abstract model 60 for the partition 32B, locating two entries in the abstract model (arrows 84 and 86) and obtains the Path1 and Path2 path numbers from the abstract model 60. The timing path detailer then takes the Path1 and Path2 path numbers and searches in the partition debug model for these path numbers, locating the two detailed timing paths (arrows 88 and 90). The timing path detailer merges the detailed timing paths into the circuit-level merged timing report 92, along with the timing information from the circuit-level timing report 82.

Figure 10:
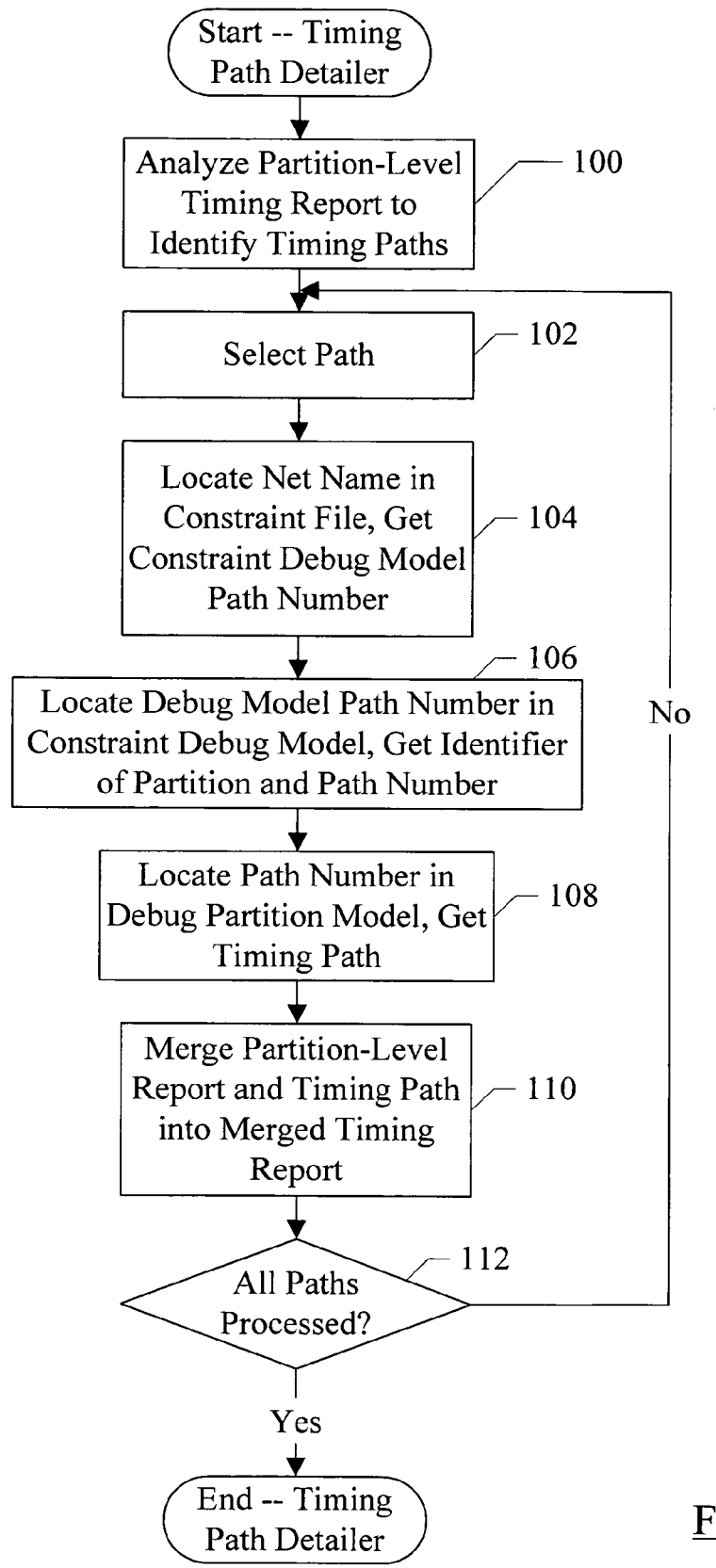
FIG. 10 is a flowchart illustrating operation of a second embodiment of a timing path detailer.

Turning now to FIG. 10, a flowchart is shown illustrating operation of one embodiment of the timing path detailer which merges detailed timing paths from other partitions with a partition-level timing report for a given partition.

The timing path detailer may analyze the partition-level timing report for a selected partition 32A–32C (e.g., one of the timing reports generated at block 50 in FIG. 3) to identify timing paths to be detailed (block 100). The timing path detailer may detail all timing paths, or only those paths which have a negative timing margin (that is, those timing paths that are not meeting timing goals), or only timing paths selected by the designer (e.g. via an input mechanism such as an input file).

The timing path detailer may select a timing path for which to generate the details, from the set of timing paths identified in block 100 (block 102). The path may be identified by a net name of a net that is not meeting timing goals (e.g. a partition output, a state point, etc.). Additionally, the detailed timing path within the partition is indicated in the partition-level timing report. However, details of the global timing path (of which the partition-level timing path is a part) may not be indicated in the partition-level timing report. The timing path detailer may search the constraint file 64 to locate the net name, and obtain the corresponding path number in the constraint debug model 66 (block 104). As mentioned above, while a path number is used in this embodiment, any path identifier may be used in other embodiments. In some embodiments, it may be possible for more than one path to be located for a net name. For example, if a path passes transparently through a state point, the transparent path and the path from the clock at the state point may be located.

The timing path detailer searches the constraint debug model 66 to locate the path number identified above, and to obtain the corresponding identifier of the partition that includes the detailed timing path information for the path that causes the timing constraint. Additionally, the identifier may identify the path number (or other path identifier) in the corresponding partition debug model of the detailed timing path (block 106). The timing path detailer may then search the corresponding partition debug model for the path number indicated by the identifier, and thus obtain the detailed timing path (block 108).

The timing path detailer merges the partition-level timing report information (which may include the detailed timing path within the partition) for the timing path with the detailed path information from other partitions into a merged timing report (block 110). Thus, the merged timing report includes the timing information from the partition level and the timing path details from the partition-level, as well as from timing path details from the other partitions which form the global timing path. Having the information gathered together may present a more complete view of the problematic global timing path. For example, the detailed path information from other partitions may indicate that changes in another partition may be a better approach then making changes in the partition corresponding to the partition-level timing report.

If there are additional timing paths to be processed (decision block 112—no leg), the timing path detailer may return to block 102, select the next path, and process the path. If there are no additional timing paths to be processed (decision block 112—yes leg), the timing path detailer has completed the merged timing report and may exit.

It is noted that, in some embodiments, the constraint debug model 66 may include the detailed timing path instead of the abstracted timing path. For example, the timing analysis tool may perform the work of mapping from the abstracted timing path to the detailed timing path. In such embodiments, block 108 may be eliminated and the detailed timing path may be obtained from the constraint debug model 66. In other embodiments, the timing path detailer may provide the abstracted timing path from the constraint debug model 66 in the partition-level merged timing report. In such embodiments, block 108 may also be eliminated.

It is noted that, while the embodiment of FIG. 10 illustrates processing one timing path at a time, other embodiments may process paths interactively at the request of the designer. For example, the timing path detailer may be part of a timing tool that presents the timing report information (e.g. graphically), and, when a designer selects a given path to view more details of the path from other partitions, the timing path detailer may operate similar to blocks 102–110 to provide the detailed timing path.

Figure 11:
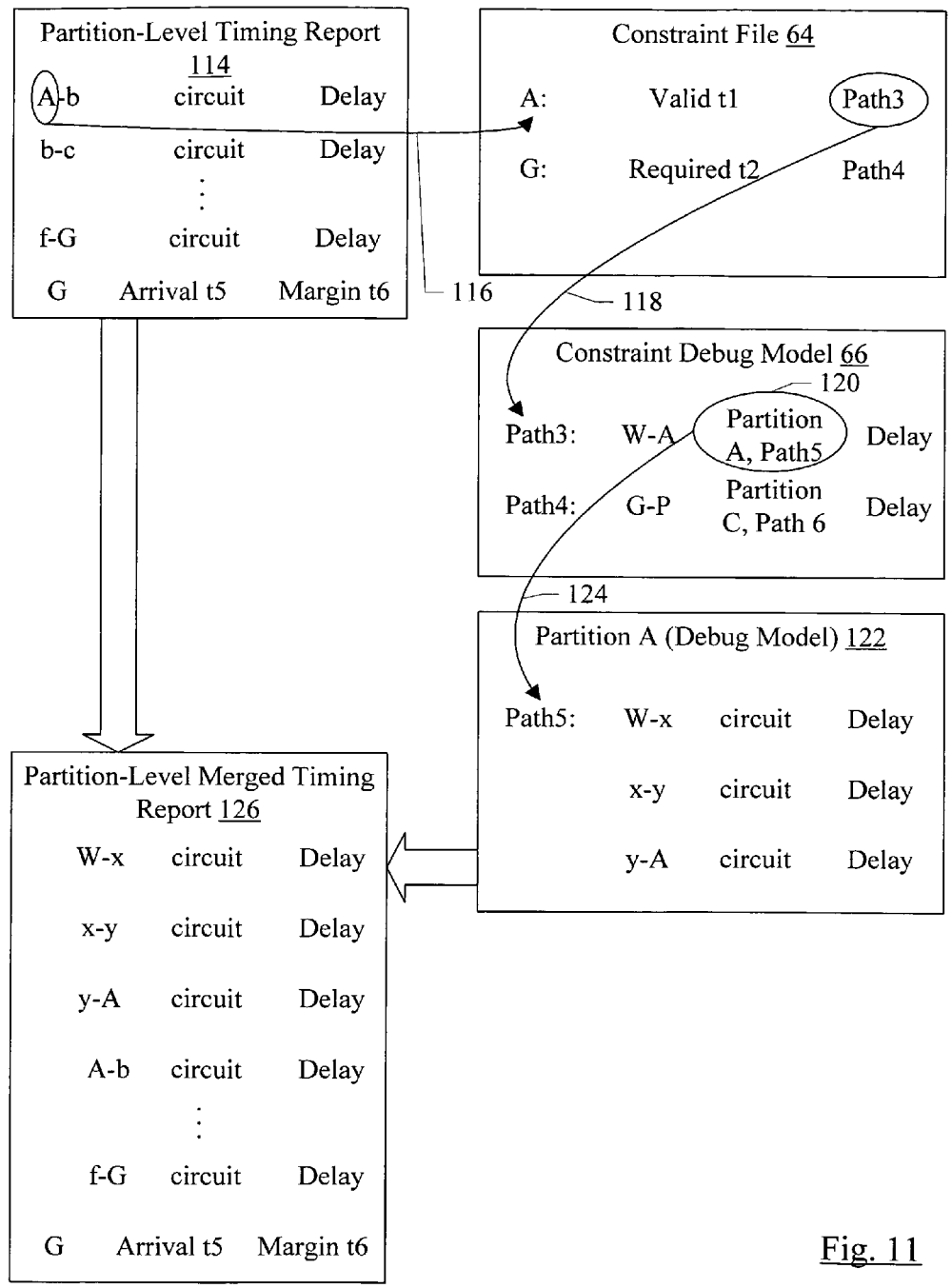
FIG. 11 is an example of merging of timing information performed by the timing path detailer illustrated in FIG. 10.

FIG. 11 is an example illustrating merging a partition-level timing report 114 for partition B 32B and the detailed timing path from partition A 32A. The partition-level timing report 114 includes a path from partition input A to partition output G with a negative timing margin. Included in the path in the constraint that input A has a valid timing constraint t1 (shown in the constraint file 64). Based on the net name A, the timing path detailer locates the timing constraint in the constraint file 64 (arrow 116). The timing path detailer obtains the corresponding path number for the constraint debug model 66 (Path3 in this example). The timing path detailer searches the constraint debug model 66 (arrow 118), locating the path number Path3 and thus the corresponding partition/path number identifier (reference numeral 120). The timing path detailer uses the identifier to identify the partition debug model for partition A (reference numeral 122) and to search for the path number (Path5 in this example) in that partition debug model 122 (arrow 124). The timing path detailer thus locates the detailed timing path in partition A 32A for the partition input A to the partition B 32B, and merges the detailed timing path in to the partition-level merged timing report 126.

In a similar fashion, the portion of the global path that is fed by the partition output G (which causes the required time constraint for the partition output G) may also be merged into the merged partition-level timing report 126.

It is noted that the above discussion has described searching various files using various search strings (e.g. net names, paths, etc.). In some cases, the files may be large and may be arranged in random order with respect to the search string. In one implementation, an American Standard Code for Information Interchange (ASCII) hash search algorithm may be used. To implement the algorithm, the file to be searched may be mapped to a search list. For each line in the file, a ASCII sum is created by mapping each character in the line to its ASCII equivalent, and summing the ASCII values. Additionally, the byte offset of the line within the file is noted. The list of ASCII sums and associated byte offsets is sorted by the ASCII sum to create the search list. To search for a given search string, the search string is converted to an ASCII search sum in a similar fashion (converting each character of the search string to its ASCII equivalent and summing the ASCII values). A binary cut and seek of the search list is performed based on the ASCII search sum to find the sum or sums in the list that match. For each resulting match, the corresponding byte offset in the file is read and compared to the search string to see if a match is detected. Thus, only a limited portion of the file (those lines having an ASCII sum that matches the ASCII search sum) may be searched, saving time over searching the entire file for a match, on average.

It is noted that, at various points, the delay of a path is described. In some embodiments, a path may have both a rising delay (the delay of a transition from zero, or a low voltage, to one, or a high voltage) and a falling delay (the delay of a transition from one or a high voltage, to zero, or a low voltage). The rising delay and the falling delay may be sourced from different paths, in some cases. Similarly, timing constraints may include rising and falling values.

Figure 12:
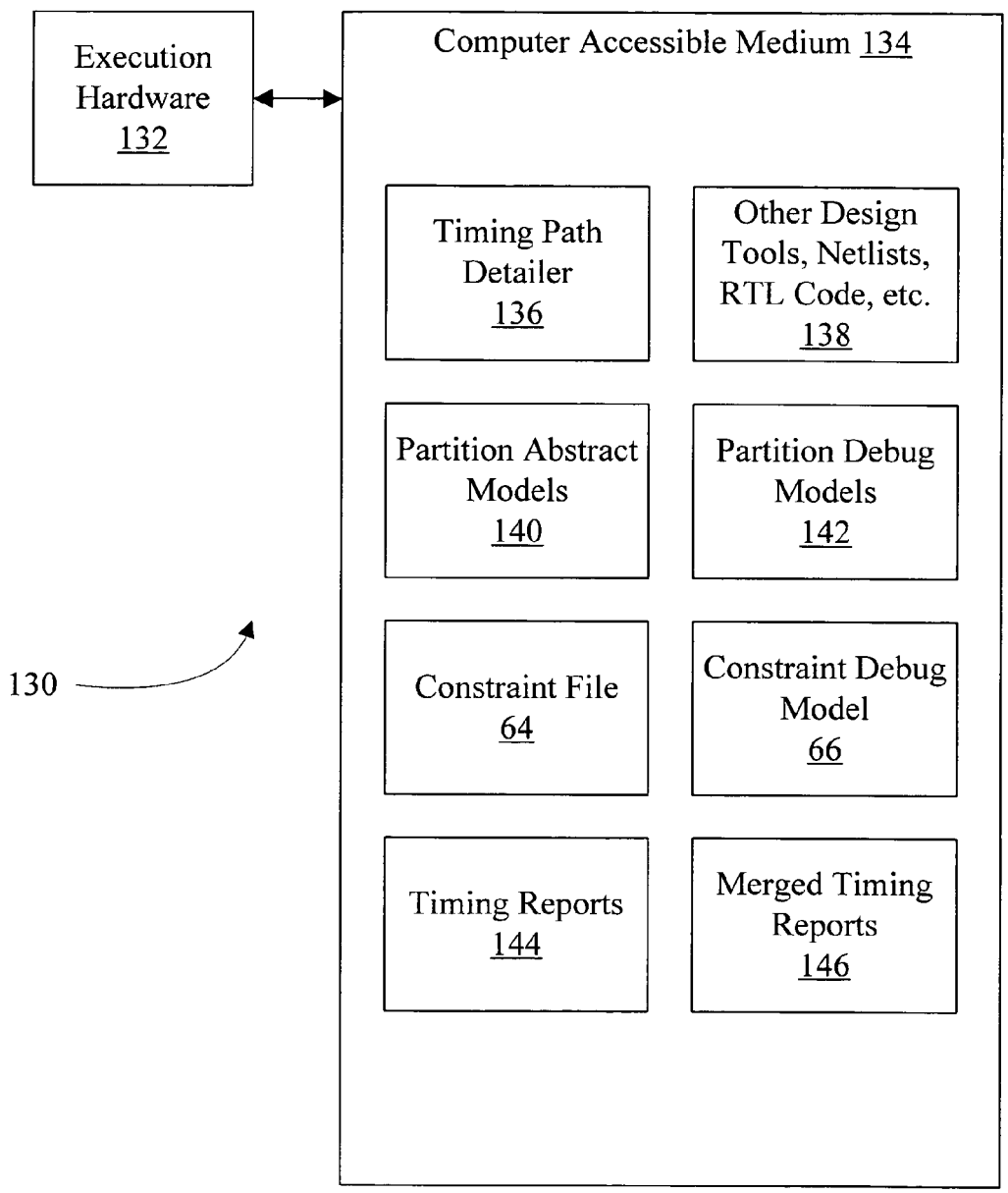
FIG. 12 is a block diagram of one embodiment of a computing system including a computer accessible medium.

Turning next to FIG. 12, a block diagram of a computing system 130 is shown. In the embodiment of FIG. 12, the computing system 130 includes execution hardware 132 and a computer accessible medium 134 coupled thereto. The computer accessible medium 134 stores the timing path detailer 136 (which may implement either of the embodiments shown in FIGS. 8 and 10, or both embodiments), and may include other design tools, netlists, RTL code, etc. (reference numeral 138). The computer accessible medium 134 further stores one or more partition abstract models 140 (e.g. the partition abstract model 60 may be one of the partition abstract models 140). The computer accessible medium 134 further stores one or more partition debug models 142 (e.g. the partition debug model 62 and/or 122 may be one of the partition debug models 142). The computer accessible medium 134 further stores the constraint file 64, the constraint debug model 66, one or more timing reports 144 (e.g. the timing reports 82 and/or 114 may be included), and one or more merged timing reports 146 (e.g. the merged timing reports 92 and/or 126 may be included).

The execution hardware 132 may include any hardware for executing the timing path detailer 136 (and/or the other design tools 108). For example, the execution hardware 132 may be a computer system coupled to the computer accessible medium 134 via a network or other external peripheral connection. Alternatively, the execution hardware 132 may comprise one or more processors, memory, and other peripherals incorporated into a computer system which also includes the computer accessible medium 134.

The computer accessible medium 134 may include storage media such as magnetic or optical media, e.g., disk, CD-ROM, or DVD-ROM, volatile or non-volatile memory media such as RAM (e.g. SDRAM, RDRAM, SRAM, etc.), ROM, etc., as well as media accessible via transmission media or signals such as electrical, electromagnetic, or digital signals, conveyed via a communication medium such as a network and/or a wireless link.

Numerous variations and modifications will become apparent to those skilled in the art once the above disclosure is fully appreciated. It is intended that the following claims be interpreted to embrace all such variations and modifications.

What is claimed is:

1. A method comprising:

analyzing a partition-level timing report for a first partition of a circuit to identify one or more timing paths;

selecting a first timing path from the partition-level timing report to generate details for the first timing path, in which a timing constraint applied to the first timing path is associated with a second timing path in a second partition;

locating a net name to which the timing constraint is applied in a constraint file to obtain a corresponding path identifier located in a constraint debug model;

locating the path identifier in the constraint debug model to obtain a partition identifier for the second partition and the second timing path associated with the timing constraint;

locating the second timing path in a debug model for the second partition; and merging details of the second timing path in the second partition with the partition-level timing report for the first partition to generate a merged timing report that includes details from the first and second partitions.

2. The method of claim 1 wherein the timing constraint corresponds to a valid time for an input to the first timing path.

3. The method of claim 1 wherein the timing constraint corresponds to a required time for an output from the first timing path.

4. The method of claim 1 wherein the first timing path has multiple timing constraints and wherein the merged timing report includes timing paths for each timing constraint.

5. The method of claim 1 wherein the timing constraint is caused by more than one timing path.

6. The method of claim 1 wherein the merged timing report includes timing information for the first partition and timing details from the first and second partitions to provide timing information on a global timing path across multiple partitions.

* * * * *